United States Patent
Park et al.

(10) Patent No.: US 7,884,375 B2
(45) Date of Patent: Feb. 8, 2011

(54) SOLAR CELL, UNEVEN SURFACE ON AN INSULATION LAYER AS A SCREEN MESH PATTERN, AND MANUFACTURING METHOD THEREOF

(75) Inventors: Sang-Wook Park, Yongin-si (KR); Dae-Won Kim, Yongin-si (KR); Eun-Chel Cho, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 464 days.

(21) Appl. No.: 11/648,375

(22) Filed: Dec. 28, 2006

(65) Prior Publication Data
US 2007/0290283 A1  Dec. 20, 2007

(30) Foreign Application Priority Data
Dec. 29, 2005  (KR)  ........... 10-2005-0134211

(51) Int. Cl.
H01L 31/00 (2006.01)
H01L 21/00 (2006.01)
H01L 33/00 (2006.01)
H01L 27/14 (2006.01)

(52) U.S. Cl. .............. 257/80; 257/53; 257/79; 257/414; 257/432

(58) Field of Classification Search ......... 257/431, 257/466, E27.124, E27.125, E27.126, E25.007, 257/E25.009, 53, 79, 80, 414, 432
See application file for complete search history.

(56) References Cited

U.S. PATENT DOCUMENTS

| | | | | |
|---|---|---|---|---|
| 4,320,250 A | * | 3/1982 | Corwin et al. | 136/256 |
| 4,322,571 A | * | 3/1982 | Stanbery | 136/255 |
| 5,738,961 A | * | 4/1998 | Chen | 430/22 |
| 5,861,707 A | * | 1/1999 | Kumar | 313/309 |
| 6,084,175 A | * | 7/2000 | Perry et al. | 136/256 |
| 6,228,181 B1 | * | 5/2001 | Yamamoto et al. | 148/33.5 |
| 6,429,037 B1 | * | 8/2002 | Wenham et al. | 438/57 |
| 6,552,414 B1 | * | 4/2003 | Horzel et al. | 257/655 |
| 6,620,640 B2 | * | 9/2003 | Gilton | 438/20 |
| 6,806,629 B2 | * | 10/2004 | Sung | 313/310 |

(Continued)

FOREIGN PATENT DOCUMENTS

JP    2002-329880    11/2002

OTHER PUBLICATIONS

European Search Report dated Apr. 19, 2007, for EP 06127291.0, in the name of Samsung SDI Co., Ltd.

(Continued)

*Primary Examiner*—Teresa M Arroyo
(74) *Attorney, Agent, or Firm*—Christie, Parker & Hale, LLP

(57) ABSTRACT

A solar cell and a manufacturing method thereof. A method of manufacturing a solar cell includes: forming an emitter layer on a first surface of a semiconductor substrate; forming an insulation layer on the emitter layer; applying a chemical compound including a dopant having a conductive type of the emitter layer on the insulation layer according to a pattern; forming a high concentration emitter portion by removing a portion of the insulation layer corresponding to a positioning of the chemical compound and diffusing the dopant toward the emitting layer; removing the chemical compound; and forming a first electrode electrically connected to the high concentration emitter portion.

6 Claims, 3 Drawing Sheets

U.S. PATENT DOCUMENTS

| | | | |
|---|---|---|---|
| 7,196,018 B2 * | 3/2007 | Szlufcik et al. | 438/745 |
| 2002/0153039 A1 | 10/2002 | Moon et al. | |
| 2003/0168957 A1 * | 9/2003 | Sung | 313/311 |
| 2004/0112426 A1 * | 6/2004 | Hagino | 136/261 |
| 2005/0118440 A1 | 6/2005 | Mahon et al. | |
| 2008/0092944 A1 * | 4/2008 | Rubin | 136/252 |
| 2008/0290368 A1 * | 11/2008 | Rubin | 257/184 |
| 2010/0018565 A1 * | 1/2010 | Funakoshi | 136/244 |

OTHER PUBLICATIONS

Japanese Office action dated Oct. 20, 2009, for corresponding Japanese application 2006-340400, noting listed reference in this IDS.

* cited by examiner

SOLAR CELL, UNEVEN SURFACE ON AN INSULATION LAYER AS A SCREEN MESH PATTERN, AND MANUFACTURING METHOD THEREOF

CROSS-REFERENCE TO RELATED APPLICATION

This application claims priority to and the benefit of Korean Patent Application No. 10-2005-0134211, filed on Dec. 29, 2005, in the Korean Intellectual Property Office, the entire content of which is incorporated herein by reference.

BACKGROUND OF THE INVENTION

1. Field of the Invention

The present invention relates to a solar cell and a manufacturing method thereof.

2. Description of the Related Art

A conventional solar cell generates electrical energy from solar energy. The solar cell is environmentally friendly, and its energy source is virtually endless. In addition, the solar cell has a long lifespan. Examples of the solar cell include a silicon solar cell and a dye-sensitized solar cell.

The silicon solar cell includes a semiconductor substrate and an emitter layer that constitute a p-n contact area having different conductive types, an insulation layer and a front electrode that are formed on the emitter layer, and a rear electrode formed on the semiconductor substrate.

The emitter layer is formed by doping a first surface of the semiconductor substrate with a dopant. In consideration of a contact resistance between the front electrode and the emitter layer, the doping may be performed with a high concentration of the dopant.

However, in order to minimize recombination occurring at a surface of the solar cell, the doping may be performed with a low concentration of the dopant. As such, when the emitter layer is formed with a uniform doping concentration, necessary characteristics of the solar cell cannot be entirely satisfied (or met).

A silicon solar cell has been provided in which a high concentration emitter portion is formed together with an emitter layer at a region where the front electrode is formed. In order to form the high concentration emitter portion, a dopant is additionally applied after an insulation layer is patterned through photolithography and etching processes. However, since the above may require expensive equipment and materials to pattern the insulation layer, as well as an additional application of the dopant, a manufacturing process of the silicon solar cell may be complex.

SUMMARY OF THE INVENTION

Aspects of the present invention respectively provide a solar cell and a manufacturing method thereof by which a solar cell having a high concentration emitter portion can be manufactured using a simple and inexpensive process.

According to an embodiment of the present invention, a method of manufacturing a solar cell includes: forming an emitter layer on a first surface of a semiconductor substrate; forming an insulation layer on the emitter layer; applying a chemical compound including a dopant having a conductive type of the emitter layer on the insulation layer according to a pattern; forming a high concentration emitter portion by removing a portion of the insulation layer corresponding to a positioning of the chemical compound and diffusing the dopant toward the emitting layer; removing the chemical compound; and forming a first electrode electrically connected to the high concentration emitter portion.

The dopant may include phosphorus (P), and the chemical compound may further include phosphorus pentoxide ($P_2O_5$) and/or phosphorus chloride oxide ($POCl_3$).

The chemical compound may be applied by using a process selected from the group consisting of screen printing, dispensing, electroless-plating, electroplating, and combinations thereof.

The high concentration emitter portion may be formed by performing a thermal annealing process for diffusing the dopant.

The thermal annealing process may be performed at a temperature in a range from about 850° C. to about 950° C.

The pattern of the chemical compound may correspond to a pattern by which the first electrode is formed.

The method may further include forming a second electrode on a second surface of the semiconductor substrate, the second electrode being electrically connected to the semiconductor substrate.

According to another embodiment of the present invention, a solar cell includes: a semiconductor substrate; an emitter layer disposed on the semiconductor substrate; a first electrode disposed on the emitter layer and electrically connected to the emitter layer; and an insulation layer disposed on one or more regions of the emitter layer where the first electrode is not disposed. The emitter layer includes a high concentration emitter portion corresponding to a positioning of the first electrode. The insulation layer includes a substantially uneven surface in contact with the first electrode.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

In the following detailed description, only certain exemplary embodiments of the present invention are shown and described, by way of illustration. As those skilled in the art would recognize, the described exemplary embodiments may be modified in various ways, all without departing from the spirit or scope of the present invention. Accordingly, the drawings and description are to be regarded as illustrative in nature, and not restrictive.

FIGS. 1A, 1B, 1C, 1D, 1E, 1F, 1G, 1H and 1I are cross-sectional views illustrating a method of manufacturing a solar cell according to an embodiment of the present invention.

Figure 1A:
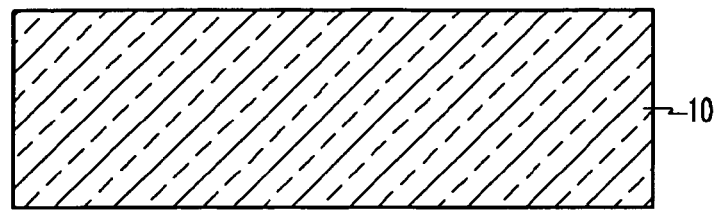
FIGS. 1A, 1B, 1C, 1D, 1E, 1F, 1G, 1H and 1I are cross-sectional views illustrating a method of manufacturing a solar cell according to an embodiment of the present invention.

Referring first to FIG. 1A, a p-type semiconductor substrate 10 formed of silicon is prepared (or provided). However, embodiments of the present invention are not limited thereto, and thus an n-type semiconductor substrate may be prepared. In addition, the semiconductor substrate may be formed by any of various suitable semiconductor materials other than (or in addition to) silicon.

To improve characteristics of the solar cell, a pre-process may be carried out in which impurities are removed by using a washing solution after the semiconductor substrate 10 is etched by using an alkaline aqueous solution and/or an acid blend solution. A damaged part in (or of) the semiconductor substrate 10 is removed through etching, and a surface of the semiconductor substrate 10 accordingly becomes uneven. Here, it is possible to reduce a loss of solar energy.

Figure 1B:
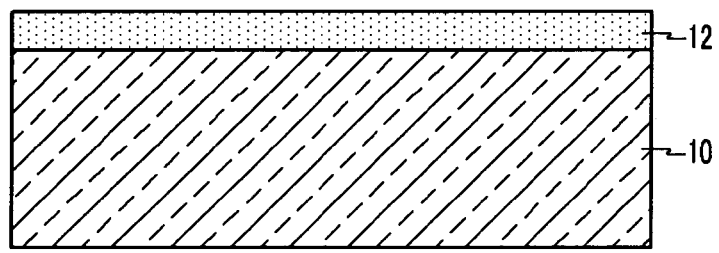

As shown in FIG. 1B, a front surface of the semiconductor substrate 10 is doped with a dopant. An n-type emitter layer 12 is thereby formed. Although phosphorus (P) is used as the dopant by way of example in one embodiment to form the n-type emitter layer 12, any of various suitable materials other than (or in addition to) phosphorus may be used as the dopant. Embodiments of the present invention are not limited thereto, and thus any of various suitable materials can be used such that a conductive type of the emitter layer 12 is opposite with respect to that of the semiconductor substrate 10. Therefore, when an n-type semiconductor substrate is used, a p-type emitter layer should be formed.

The front surface of the semiconductor substrate 10 may be doped using any of various suitable doping methods such as a high-temperature diffusion method, a spray method, a screen printing method, and/or an ion shower method.

After the doping, a process for removing nonessential phosphorus silicate glass (PSG) using a fluoric acid aqueous solution may be carried out.

Figure 1C:
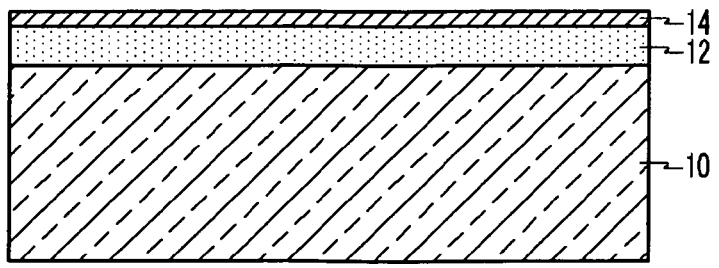

As shown in FIG. 1C, an insulation layer 14 is formed on the emitter layer 12. The insulation layer 14 may be a silicon nitride layer, a silicon oxide layer, and/or a titanium oxide layer formed by using any of various suitable methods such as a plasma enhanced chemical vapor deposition method, an electron beam deposition method, a screen printing method, and/or a spray method.

The insulation layer 14 serves not only to reduce reflection of solar rays that are incident thereto, but also to reduce (or prevent) electron loss that may occur at a surface of the semiconductor substrate 10. That is, electron loss may occur at the surface of the semiconductor substrate 10 due to dangling bonds, and this can be reduced (or prevented) by forming the insulation layer 14.

Figure 1D:
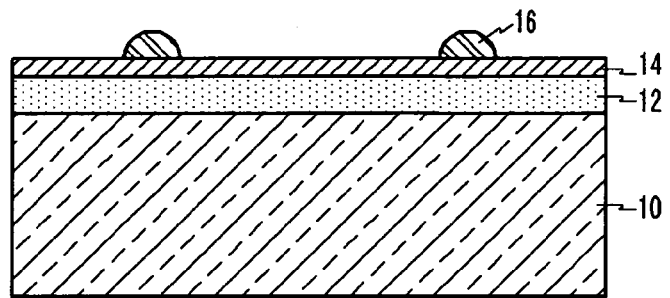

As shown in FIG. 1D, in one embodiment, a chemical compound 16 containing phosphorus (P) is applied to the insulation layer 14 by using a screen printing method. However, embodiments of the present invention are not limited thereto. That is, the chemical compound 16 may be applied to the insulation layer 14 by using any of various suitable methods such as screen printing, a dispensing method, an electroless-plating method, and/or an electroplating method. The chemical compound 16 is applied to correspond to a pattern by which a first electrode 22 (see, for example, FIG. 1I) is to be provided on the emitter layer 12, such that a high concentration emitter portion 12a (see, for example, FIG. 1E) is located below the first electrode 22.

In the chemical compound 16, phosphorus may exist in the form of phosphorus pentoxide ($P_2O_5$) and/or phosphorus chloride oxide ($POCl_3$). Although phosphorus is used as the dopant in the present embodiment, embodiments of the present invention are not limited thereto. That is, any of various suitable materials may be used as the dopant so long as the dopant of the chemical compound 16 has a same conductive type as the emitter layer 12. In addition, embodiments of the present invention are not limited to a conductive type of the dopant and the emitter layer (i.e., the invention is not limited to a type of major carriers in the dopant and the emitter layer). In one embodiment, a portion of the insulation layer 14 is etched by the chemical compound 16 including the dopant through a thermal annealing process.

Figure 1E:
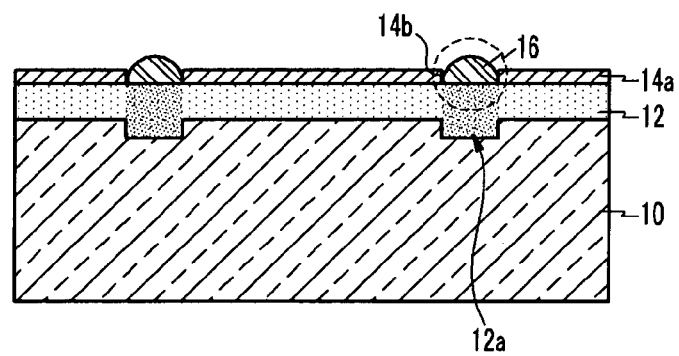

As shown in FIG. 1E, the portion of the insulation layer 14 is etched to form an insulation layer 14a, and the high-concentration emitter portion 12a is formed by performing the thermal annealing process on the semiconductor substrate 10 having the emitter layer 12, the insulation layer 14, and the chemical compound 16 applied thereon. That is, during the thermal annealing process, phosphorus pentoxide ($P_2O_5$) and/or phosphorus chloride oxide ($POCl_3$) contained in the chemical compound 16 removes (or eliminates) the portion of the insulation layer 14 located below the chemical compound 16, and phosphorus contained in the chemical compound 16 is diffused towards the semiconductor substrate 10 at the removed portion of the insulation layer 14. The high concentration emitter portion 12a of the semiconductor substrate 10 is thereby formed.

Figure 1F:
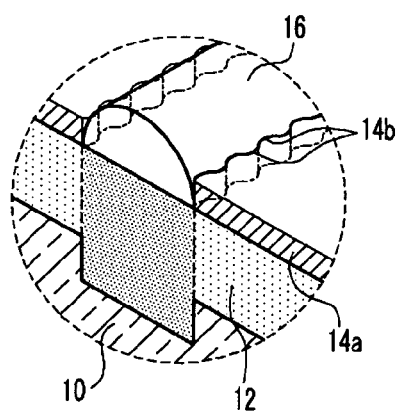

Here, since the portion of the insulation layer 14 is removed by the chemical compound 16 that has been screen printed, as shown in an exploded partial perspective view in FIG. 1F, a substantially uneven part (or surface) 14b is formed on the insulation layer 14a according to a screen mesh pattern.

As described above, in the present embodiment, a photolithography process or a mask etching process is not required when the insulation layer 14 is patterned according thereto. Thus, expensive equipment and/or materials are not required, and a manufacturing cost can be significantly reduced as a result. In addition, since the high concentration emitter portion 12a can be formed without using an additional doping process, the manufacturing process can be simplified.

The thermal annealing process may be carried out at a temperature in a range from 850° C. to 950° C. At a high temperature above 950° C., the semiconductor substrate 10 is more likely to be damaged by the thermal annealing process. At a low temperature below 850° C., diffusion may not occur to a sufficiently high degree.

An infrared lamp, a furnace, or the like may be used as a heat source in the thermal annealing process. For example, when the infrared lamp is used, the thermal annealing process may be carried out for a period in a range from 10 seconds to 10 minutes.

Figure 1G:
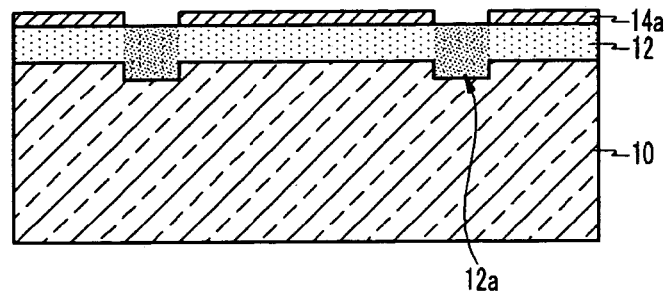

As shown in FIG. 1G, ultra-pure water may be used to wash the semiconductor substrate 10, thereby removing the chemical compound 16. Here, a surfactant may be used in consideration of materials composing the chemical compound 16.

Figure 1H:
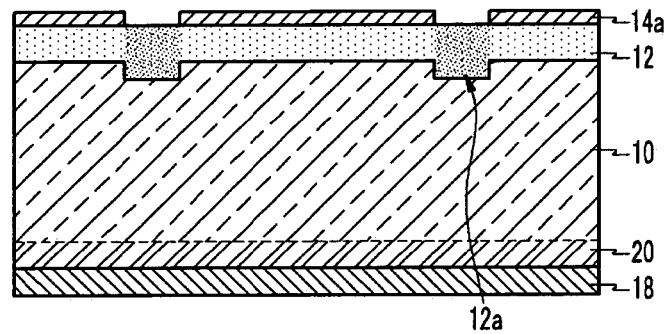

As shown in FIG. 1H, in one embodiment, an aluminum paste is screen-printed on a rear surface of the semiconductor substrate 10, and a thermal annealing process is then carried out. As a result, a second electrode 18 electrically connected to the semiconductor substrate 10 is formed. However, embodiments of the present invention are not limited thereto. That is, the second electrode 18 may be formed of any of various suitable materials other than (or in addition to) aluminum.

Aluminum is diffused over the rear surface of the semiconductor substrate 10 through the thermal annealing process to a certain thickness (which may be predetermined), and thus a p+ type of rear electric field layer 20 is formed. The rear electric field layer 20 forms an electric field such that optically excited electrons are blocked (or prevented) from moving to the rear surface of the semiconductor layer 10.

Figure 1I:
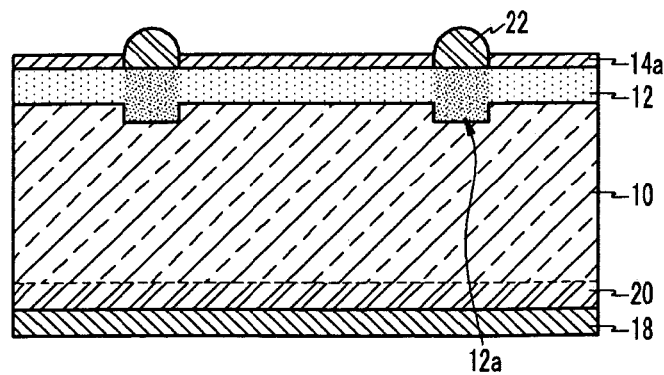

As shown in FIG. 1I, the first electrode 22 is formed on the front surface of the semiconductor substrate 10 such that the first electrode 22 corresponds to a region from where the chemical compound 16 was removed, that is, a region adjacent to the high concentration emitter portion 12a. The first electrode 22 may be formed by using any of various suitable methods such as screen printing, an electroless-plating method, an electroplating method, an inkjet method, and/or a dispensing method. For example, the first electrode 22 may be formed of silver (Ag).

In the solar cell of the present embodiment, a contact resistance can be effectively reduced since the first electrode 22 is formed on the high concentration emitter portion 12a.

Moreover, since the relatively low concentration emitter layer 12 is formed on a region where the first electrode 22 is not formed, a charge loss may be reduced.

When light is incident to the solar cell produced according to the manufacturing method of embodiments of the present invention, pairs of positive holes and electrons formed by a photoelectric effect are divided. Accordingly, the electrons are accumulated on the n-type emitter layer 12, and the positive holes are accumulated on the p-type semiconductor substrate 10, thereby generating an electrical potential difference. The electrical potential difference allows current to flow through the first electrode 22, the second electrode 18, and an external circuit. As described above, the conductive type of the semiconductor substrate 10 and the conductive types of the emitter layer 12 and the high concentration emitter portion 12a can be modified in any of various suitable forms, which are included in the scope of the present invention.

According to a method of manufacturing a solar cell of embodiments of the present invention, an insulation layer can be patterned at a low cost by using a chemical compound for etching the insulation layer. The chemical compound includes a dopant having the same conductive type as the emitter layer, and thus a high concentration emitter portion can be formed concurrently with the patterning of the insulation layer without an additional doping process. Therefore, the solar cell having the high concentration emitter portion can be manufactured using simple processes.

In addition, a contact resistance can be reduced since the first electrode is formed on the high concentration emitter portion. Moreover, since a relatively low concentration emitter layer is formed at a region where the first electrode is not formed, it is possible to reduce charge loss. Consequently, various characteristics of the solar cell can be improved.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A solar cell comprising:
   a semiconductor substrate;
   an emitter layer disposed on the semiconductor substrate;
   a first electrode disposed on and electrically connected to the emitter layer in one or more first regions; and
   an insulation layer disposed on one or more second regions of the emitter layer where the first electrode is not disposed,
   wherein the emitter layer comprises a high concentration emitter portion corresponding to the one or more first regions in which the first electrode is disposed, and
   wherein the insulation layer comprises a first substantially uneven surface on a first sidewall of the insulation layer and a second substantially uneven surface on a second sidewall of the insulation layer facing the first sidewall of the insulation layer, the first and second substantially uneven surfaces having a screen mesh pattern in contact with the first electrode.

2. The solar cell of claim 1, wherein the high concentration emitter portion is formed by:
   applying a chemical compound to a portion of the insulation layer, the chemical compound comprising a dopant;
   performing thermal annealing to eliminate the portion of the insulation layer, thereby exposing a portion of the emitter layer, using the chemical compound; and
   diffusing the dopant towards the exposed portion of the emitter layer.

3. The solar cell of claim 1, wherein at least one of the surfaces of the insulation layer is a chemical etched surface.

4. The solar cell of claim 1, wherein at least one of the surfaces of the insulation layer is patterned by utilizing a chemical compound for doping and etching the insulation layer.

5. The solar cell of claim 4, wherein the chemical compound comprises phosphorus pentoxide ($P_2O_5$) and/or phosphorus chloride oxide ($POCl_3$).

6. The solar cell of claim 1, wherein the insulation layer comprises titanium oxide.

* * * * *